(12) United States Patent
van Zeijl

(10) Patent No.: US 7,084,678 B2
(45) Date of Patent: Aug. 1, 2006

(54) FRACTIONAL FREQUENCY DIVIDER

(75) Inventor: Paulus Thomas M. van Zeijl, Hengelo (NL)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 10/482,938

(22) PCT Filed: Jul. 6, 2001

(86) PCT No.: PCT/NL01/00514

§ 371 (c)(1),
(2), (4) Date: Jul. 7, 2004

(87) PCT Pub. No.: WO03/005588

PCT Pub. Date: Jan. 16, 2003

(65) Prior Publication Data

US 2004/0252805 A1     Dec. 16, 2004

(51) Int. Cl.
*H03K 21/00* (2006.01)
*H03K 23/00* (2006.01)
*H03K 25/00* (2006.01)

(52) U.S. Cl. .................. 327/115; 327/117; 377/47; 377/48

(58) Field of Classification Search .............. None
See application file for complete search history.

(56) References Cited

U.S. PATENT DOCUMENTS

| | | | | |
|---|---|---|---|---|
| 5,059,924 A * | 10/1991 | JenningsCheck | ........... | 331/1 A |
| 5,510,742 A * | 4/1996 | Lemaire | ........... | 327/146 |
| 5,889,436 A * | 3/1999 | Yeung et al. | ........... | 331/2 |
| 5,970,110 A * | 10/1999 | Li | ........... | 377/48 |
| 5,977,805 A | 11/1999 | Vergnes et al. | ........... | 327/107 |
| 6,114,914 A * | 9/2000 | Mar | ........... | 331/16 |
| 6,526,374 B1 * | 2/2003 | Martin | ........... | 703/14 |
| 6,583,674 B1 * | 6/2003 | Melava et al. | ........... | 331/16 |
| 6,696,870 B1 * | 2/2004 | Dellow | ........... | 327/115 |
| 6,788,154 B1 * | 9/2004 | Maneatis | ........... | 331/45 |
| 6,822,488 B1 * | 11/2004 | Riley | ........... | 327/107 |

FOREIGN PATENT DOCUMENTS

| EP | 0 384 595 A |   | 8/1990 |
|----|-------------|---|--------|
| EP | 0384595     | * | 9/1990 |
| JP | 10-32486    | * | 3/1998 |

OTHER PUBLICATIONS

Patent Abstract of Japan, vol. 1998, No. 06, Apr. 30, 1998 and JP 10 032486 A filed Feb. 3, 1998.

* cited by examiner

*Primary Examiner*—Tuan T. Lam
(74) *Attorney, Agent, or Firm*—Nixon & Vanderhye, P.C.

(57) ABSTRACT

A frequency divider device includes a divider input and a phase count and select section. The phase count and select section includes at least two phase count and select inputs each communicatively connected to the divider input (for receiving each at least one phase shifted signal having a phase difference with respect to the other phase shifted signal); a signal generator section (for generating an output signal); a switch device; an inverter device; a counter device; and, a switch actuator device.

31 Claims, 8 Drawing Sheets

FRACTIONAL FREQUENCY DIVIDER

This application is the U.S. national phase of international application PCT/NL01/00514 filed in English on 06 Jul. 2001, which designated the U.S. This application claims priority to PCT/NL01/00514. The entire contents of these applications are incorporated herein by reference.

BACKGROUND

I. Field of the Invention

The invention relates to a frequency divider device, a method for dividing the frequency of a signal, a frequency generator device and a method for generating a frequency. The invention further relates to electronic devices, e.g. a receiver device, a transmitter device, a transceiver device or a phase locked loop including a frequency divider device according to the invention.

II. Related Art and Other Considerations

In the art, frequency dividers are generally known. Frequency dividers are used in numerous types of devices, for example in Phase Locked Loop (ILL) circuits. PLL circuits are used for example as integrated synthesisers which generate and define local oscillator signals in receivers, transmitters and transceivers (combined receivers and transmitters).

It is known in the art to implement frequency dividers with latches or flip-flops. The division ratio is then an integer, i.e. 2, 3, 4, 5 etc.

For realising non-integer division ratios, like for instance 2.34567, a fractional divider is known in the art. A fractional divider multiplies the incoming frequency with a first integer number N and divides this signal by a second integer number M. For suitable combinations of N and M, this results in a non-integer division ratio since the (long-term averaged) division ratio is N/M. Another option for realising a non-integer division ratio is known in the art by implementing a delta-sigma divider. The delta-sigma divider is rapidly switched between different division ratios, whereby as an average the desired fractional division ratio is obtained.

However, the known frequency dividers are disadvantageous since in PLL circuits several opposing requirements have to be met. For example, the characteristics of a PLL circuit may be described in terms of bandwidth: a large PLL-bandwidth results in a relatively short lock-in time. In a PLL circuit having a large PLL bandwidth, the noise of the voltage controlled oscillator (VCO) inside the loop-bandwidth will also be relatively low. The phase-detector, apart from generating a DC component for controlling the VCO, also generates a spurious component at twice the reference frequency. A low-pass filter has to attenuate this component sufficiently in order to obtain a spurious-free output signal. The PLL-bandwidth may be limited by the required attenuation of these spurious components. A high reference frequency is thus desirable. However, in a frequency divider having an integer division ratio the frequency step, that is the difference in frequency between one division ratio (e.g. N) and a next division ratio (N+1), equals the reference frequency. The requirements relating to the optimal characteristics like PLL-bandwidth, phase-noise, frequency step and lock-in time are thus conflicting requirements.

Furthermore, in the known fractional divider the output signal of the divider has a significant amount of jitter (as seen in the time domain) or spurious frequency components (as seen in the frequency domain). If such a fractional divider is used in a PLL the jitter or the spurious frequencies again require a compromise between the PLL-bandwidth, phase noise, frequency step and lock-in time specifications.

In a delta-sigma divider the rapid switching between different division ratios generates a lot of (random) spurious frequency components in the signal. Even though said spurious components may be located outside the PLL-bandwidth, this again requires a compromise between PLL-bandwidth and dithering-noise requirements.

SUMMARY

A frequency divider device generates significantly less spurious frequency components than prior art frequency divider devices. The frequency divider device at least includes: a divider input for receiving at least one input signal having an input frequency; a phase count and select section including: at least two phase count and select inputs each communicatively connected to the divider input, each for receiving at least one phase shifted signal having a phase difference with respect to the phase shifted signal received at the other divider input; a signal generator section for generating an output signal; a switch device having at least two switch inputs each connected to said at least one of said phase count and select inputs, said switch device further having at least one switch output, said switch device connecting a selected input of said switch inputs with said switch output; an inverter device for switching said output signal from a current state to a substantially inverse state if a selected signal from said selected input has a transition from a first state to a second state; a counter device for determining a number of periods of said selected signal; a switch actuator device for switching said switch device to another one of said switch inputs if a value of said counter device exceeds a preset switching value; and a divider output for transmitting said output signal.

A method for dividing the frequency of a signal includes: receiving at least two signals having a phase difference with respect to each other; selecting a selected signal from said signals; generating an output signal of a binary zero; and increasing the counter value if said selected signal has an upward transition: repeating the steps of generating the output signal and increasing the counter value until the counter value has a first predetermined value; and if said counter value has said first predetermined value: generating an output signal of a binary one; repeating until said counter value has a second predetermined value the steps of: selecting a selected signal, generating an output signal, increasing the counter value and repeating generating the output signal and increasing the counter value until the counter value has a first predetermined value. Such a method may be performed with a frequency divider device according to the invention.

Furthermore, an analog electronic RF circuit e.g. a receiver device, a transmitter device, a transceiver device or a PLL including a frequency divider device are provided.

A frequency generator device; at least includes: a generator input; a frequency divider device having a divider input communicatively connected to the generator input, a transition detector communicatively connected to at least two of the phase shifter outputs; a pulse generator being actuated by the transition detector; and a generator output communicatively connected to said pulse generator.

Such a device may be implemented using a frequency divider device according to the technology disclosed herein. Furthermore, a method for generating a signal of a predetermined frequency includes: receiving at least two signals having a phase difference with respect to each other; selecting a selected signal from said signals; generating an output signal of a binary zero; and increasing a counter value if said selected signal has an upward transition: repeating the steps of generating the output signal and increasing the counter value until the counter value has a first predetermined value; and if said counter value has said first predetermined value: generating an output signal of a binary one; repeating until said counter value has a second predetermined value the steps of: selecting a selected signal, generating an output signal, increasing the counter value and repeating generating the output signal and increasing the counter value until the counter value has a first predetermined value.

Such a method may be performed with a device for generating a frequency according to the technology disclosed herein.

BRIEF DESCRIPTION OF THE DRAWINGS

Further details, aspects and embodiments of will now be described with reference to the figures in the attached drawings.

DETAILED DESCRIPTION

Figure 1:
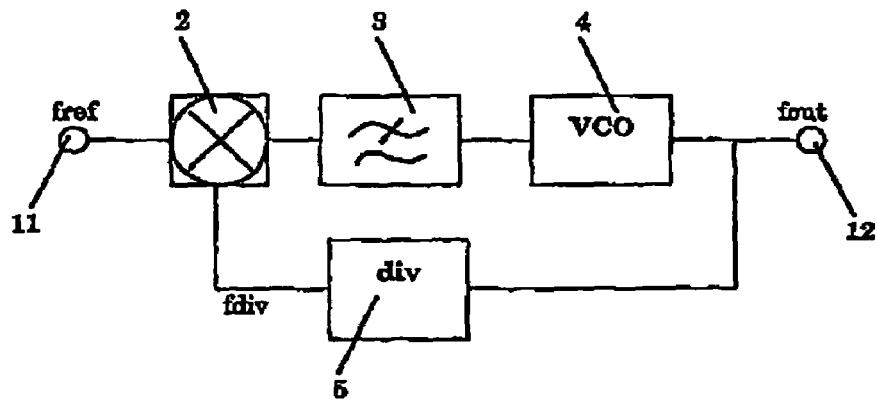
FIG. 1 shows a block diagram of a PLL.

FIG. 1 shows a general block diagram of a phase locked loop (PLL) 1. The PLL 1 has a PLL input 11 and a PLL output 12. The PLL 1 includes a phase detector 2, a low-pass filter 3, a voltage controlled oscillator (VCO) 4 and a frequency divider 5. The PLL 1 forms a feedback system. At the PLL input 11 an input signal of a reference frequency ($f_{ref}$) is input to the PLL 1. At the PLL output 12 a VCO signal of output frequency ($f_{out}$) is available. The VCO signal is generated by the VCO 4 based on a VCO input signal voltage. The VCO output signal frequency $f_{out}$ is divided by the frequency divider 5 by a division ratio N. This results in a signal of a divided frequency $f_{div}$ which is equal to:

$$f_{div} = \frac{f_{out}}{N}$$

The divided frequency $f_{div}$ is compared to the reference frequency $f_{ref}$ by phase detector 2. The detector outputs a difference signal which is based on the difference between the divided frequency $f_{div}$ and the reference frequency $f_{ref}$. The difference signal is low-pass filtered by filter 3 and used as the VCO input signal which controls the oscillation of the VCO 4.

If the PLL 1 is in lock, the VCO frequency equals the reference frequency multiplied with the division factor:

$$f_{out} = N \cdot f_{ref}$$

Figure 2:
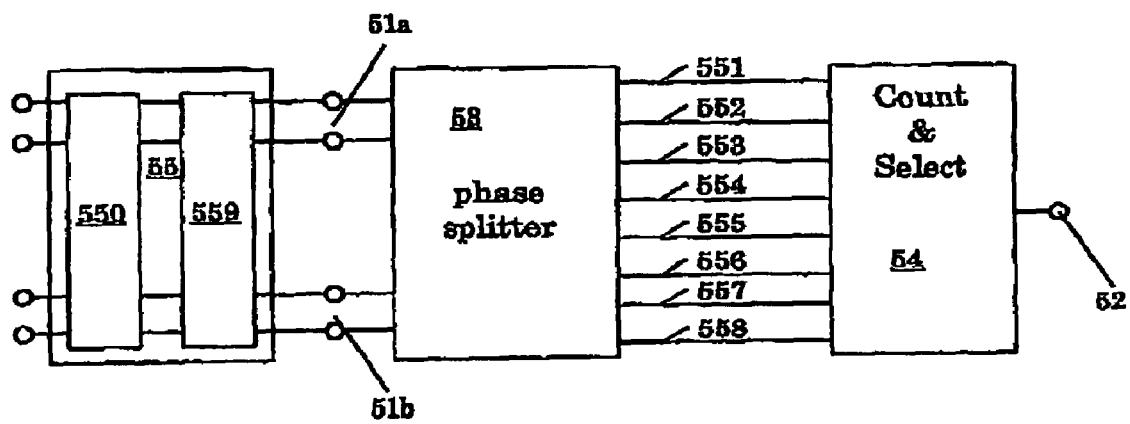
FIG. 2 shows a block diagram of an example of an embodiment of a frequency divider.

A block diagram of a frequency divider 5 according to the disclosed technology, which may be used in a PLL circuit, is shown in FIG. 2. The shown frequency divider 5 has a phase splitter section 53 and a count and select section 54. The phase splitter section 53 has two divider inputs 51a,51b. The phase splitter section 53 has a plurality of shifter outputs 551–558. In the example shown in FIG. 2, the phase of the signals at each of the shifter output connections 551–558 differs with respect to the signal at all the other shifter output connections. The respective phase differences are listed in table 1, wherein the phase at output 551 is assumed to be 0 degrees.

TABLE 1

| output | phase (degrees) |
|---|---|
| 551 | 0 |
| 552 | 45 |
| 553 | 90 |
| 554 | 135 |
| 555 | 180 |
| 556 | 225 |
| 557 | 270 |
| 558 | 315 |

Figure 3:
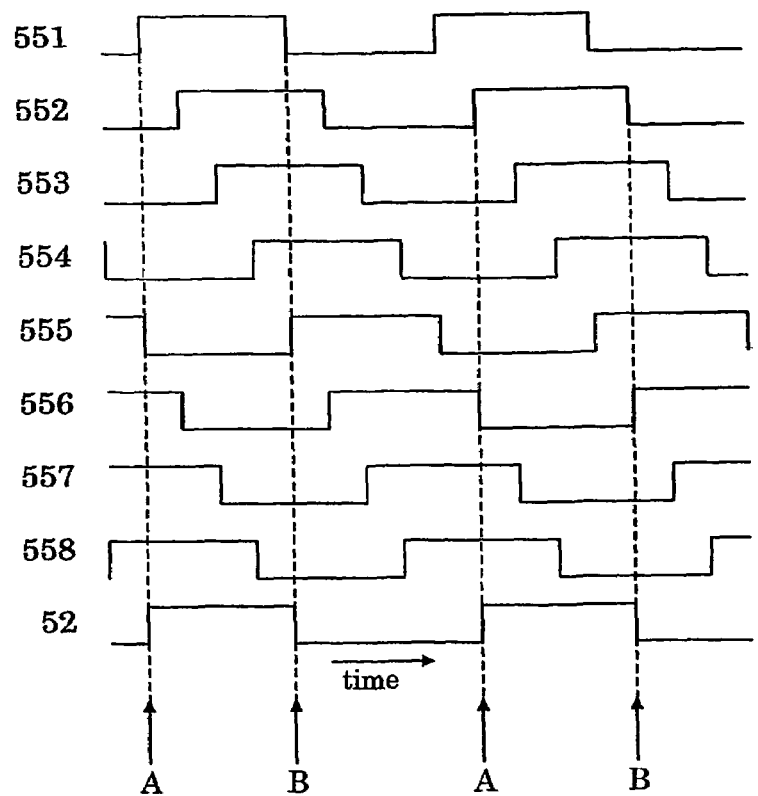
FIG. 3 schematically shows the output signals of the phase splitter section of the frequency divider in FIG. 2

The development in time of phase shifted output signals of the shifter outputs 551–558 is shown in FIG. 3. In FIG. 3 the development in time of a signal at the divider output 52 is also depicted.

Figure 4:
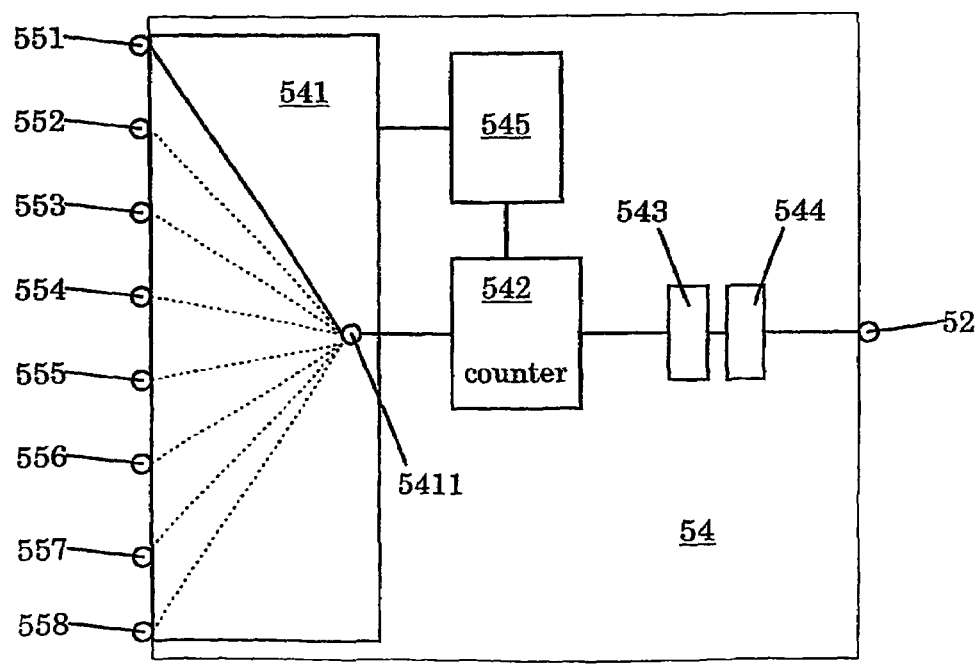
FIG. 4 shows a block diagram of an embodiment of a count and select section of a frequency divider as shown in FIG. 2
Figure 7:
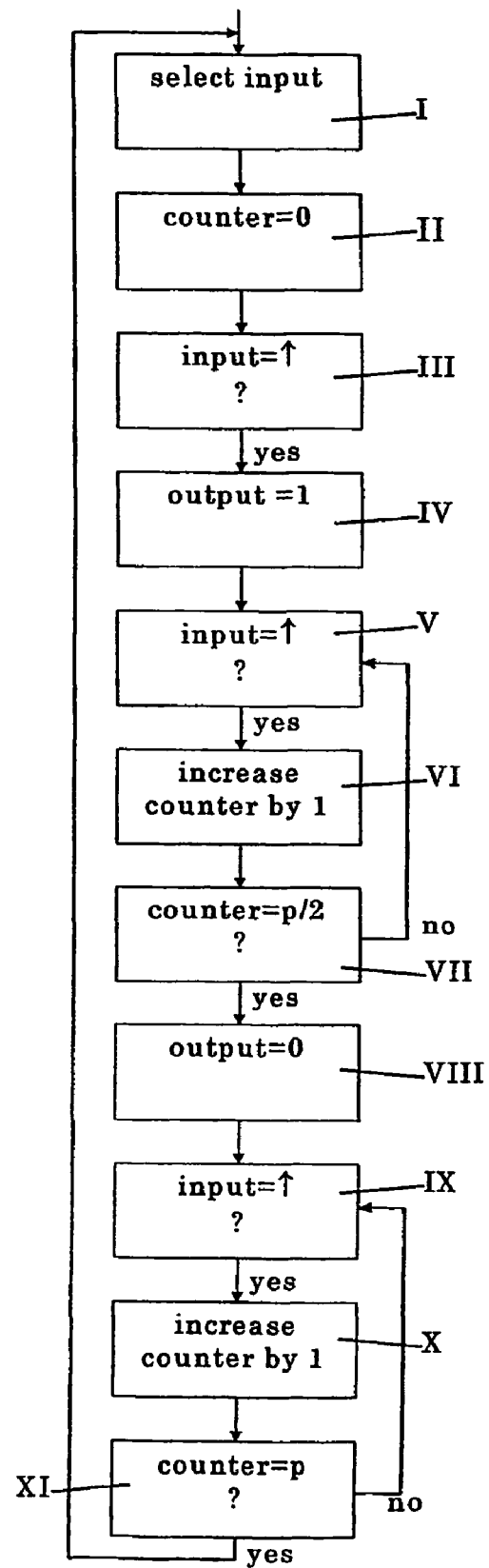
FIG. 7 shows a flow chart of a first example of a method for dividing a frequency.

In FIG. 4 a block diagram of an embodiment of the count and select section 54 is shown. The count and select section 54 may perform a method as shown in the flow-chart of FIG. 7. The count and select section 54 starts with a step I of selecting as input a selected one of the shifter outputs 551–558. The selection step I is performed by a switch section 541. In FIG. 4 output 551 is the selected output. The switch section 541 connects the selected output 551 to a switch output 5411.

From the selected output 551 a signal may be transmitted via the switch section 541 to a counter section 542. The counter section 542 counts the number of upgoing transitions of the signal at the selected shifter output 551. Initially, the counter value is set to zero in step II. As indicated with arrows A in FIG. 3, a signal generator 544 in generation step IV starts generating an output signal if the condition of step III is satisfied, that is if the signal has an upgoing transition. The generator 544 is connected to the divider output 52 and the generated output signal is the output signal of the frequency divider. As is shown in FIG. 3 in step IV the generation of a binary one output signal is thus started. The signal generator may be implemented with combinatorial logic-, such as AND, NAND, OR or NOR devices.

After starting in step IV generating the output signal, the counter section 542 in the count and select section 54 starts counting the upgoing transitions in the signal from output 551 in steps V and VI. During steps V and Vi, the output signal still has the same value as in step IV, in FIG. 3 this is a binary one value. The signal from output 551 has a 0 degrees phase shift. For each upgoing transition the criterion of step V is satisfied and in step VI the counter value is increased by one., If the counter value has reached a first predetermined value P/2, the output signal is switched from a binary one to a binary zero in step VII and VIII, as is indicated with arrows B in FIG. 3. The switching from a binary one to a binary zero is performed by a signal inverter section 543, however the switching functionality may also be implemented in the signal generator section. After the switching of steps VII and VIII, the counting continues in steps IX–X until a second predetermined criterion of step XI is satisfied. The criterion of step X1 is satisfied if the counter 542 has counted P transitions (P=1 in the example of FIG. 3). The counter 542 then repeats steps I–XI for a next input, which in the example is shifter output 552.

After the counting cycle is performed for shifter output 552 after P counts, the switch 541 is switched to the shifter output 553 by switch actuator section 545. The steps I–IX are repeated for the other outputs up to and including output 558. Thereafter, the output 551 is selected again and the whole cycle is repeated. As can be seen in FIG. 3 the output signal at the divider output 52 has a larger period than the input signal. The period of the output signal is not an integer multiple of the input signal. This means that the frequency of the input signal is divided by a non-integer number, since the frequency of a signal is proportional to the inverse of the period thereof. In a more mathematically explanation: the period of the output signal from the count and select section 54 can be written as:

$$T_{period} = P \cdot T_{ref} + T_{res}$$

where $T_{period} = 1/f_{out}$, $Tref = 1/f_{ref}$, P is the number of periods counted and $T_{res}$ is the time interval between two adjacent signals provided by the phase-shifter ($T_{res} = T_{ref}/8$ in the example). Instead of waiting for one time interval $T_{res}$, it is possible to wait for $2*T_{res}$ or in general $Q*T_{res}$. The period then becomes:

$$T_{period} = P \cdot T_{ref} + Q \cdot T_{res}$$

In the shown example $T_{res} = T_{ref}/8$, so the period in the example is equal to:

$$T_{period} = (P + Q/8) \cdot T_{ref}$$

This is corresponds to a signal at the divider output of frequency $f_{out}$ determined by:

$$f_{out} = \frac{f_{ref}}{P + Q/8}$$

Supposing P=1 and Q=2, the resulting division ratio is P+Q/8=2.125, i.e. the division ratio is a non-integer division ratio. As can be seen in FIG. 3, the intervals between successive upgoing slopes of the output signal are all equal during one whole cycle, meaning that there is almost no timing jitter, nor spurious frequencies. This makes the new divider easily applicable in all kinds of applications.

In the shown example, the resolution is 360/4=45 degrees. However any resolution desired in the specific implementation can be used. For instance, in the case of a 3.6 degree resolution, the division number could be P+Q/100, or a multiple of 0.01.

Figure 9:
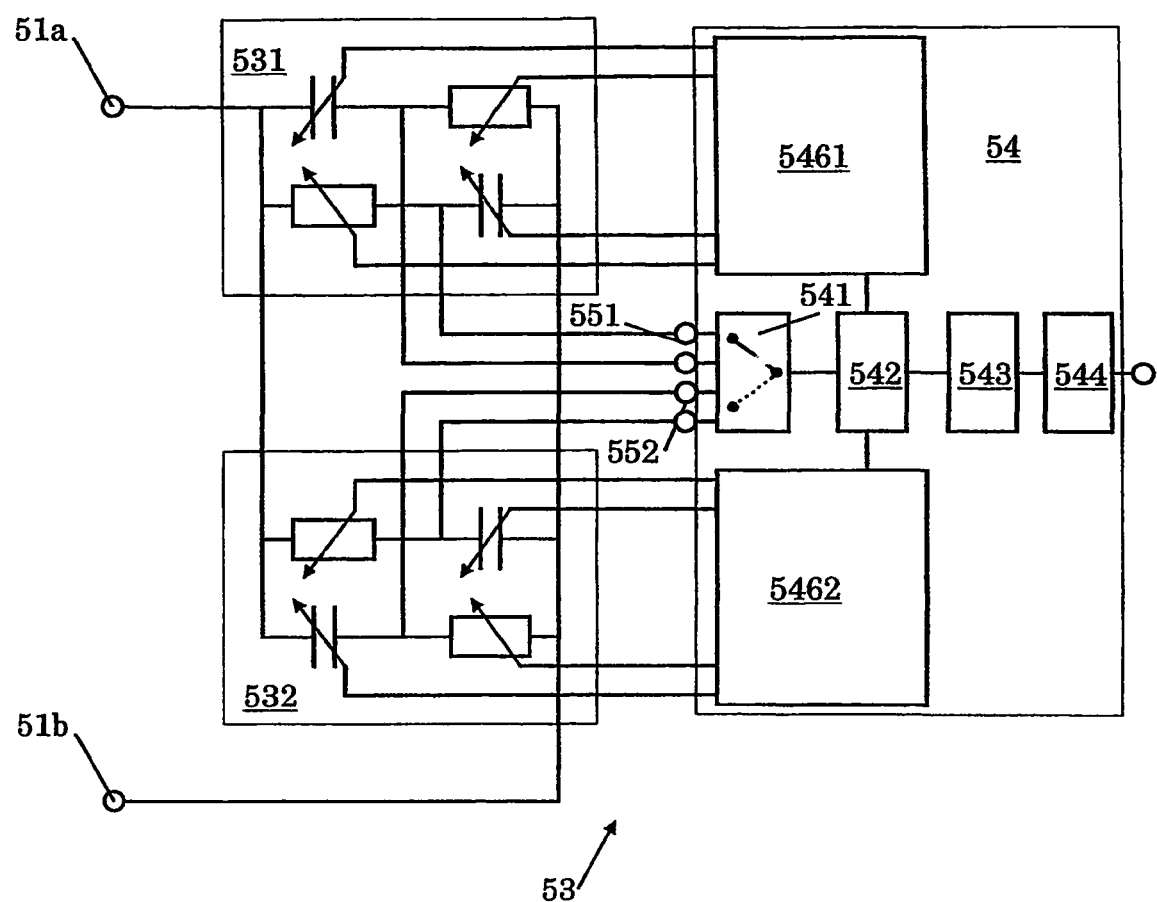
FIG. 9 shows a block diagram of an example of an embodiment of a frequency divider device in which a phase shifter section as shown in FIG. 8 is implemented.

In the example of the divider device of FIG. 2 and the count and select section shown in FIG. 4, each phase shifted signal has its own count and select input. The example of a frequency divider shown in FIG. 9, has only two count and select inputs 551–552. In the embodiment in FIG. 9 not all the different phase-shifted signals are available to the count and select section 54 at the same time. The division of the frequency is obtained using a phase shifter 53 with an adjustable phase shift and using each of the shifter outputs 551–552 for a multiple of signals with different phase shifts. In the example of FIG. 9, the count and select section 54 sets the phase shift of the shifter section 53 to a predetermined value with phase shift adjuster sections 5461 and 5462. The switch section 541 in the count and select section 54 selects one of the shifter outputs 551–552 and the section 54 performs the division operation. In FIG. 9, a first shifter output 551 is selected. After the division operation, a second shifter output 552 is selected which is set to a different phase shift and the division operation is performed again with the second shifter output. Hereby for each repetition of the division method, the phase shift is different but not all the shifted signals need to be available at the same time and the number of shifter outputs is reduced.

The count and select section 54 in FIG. 9 is substantially similar to the count and select section in FIG. 4. The switch section 541 in FIG. 9 switches between two shifter outputs 551 and 552 and besides the circuitry of the count and select section in FIG. 4, the count and select section 54 in the embodiment of FIG. 9 includes two phase shift adjusters 5461 and 5462 for adjusting the phase shift of the signals presented at the phase shifter outputs 551–552.

Figure 14:
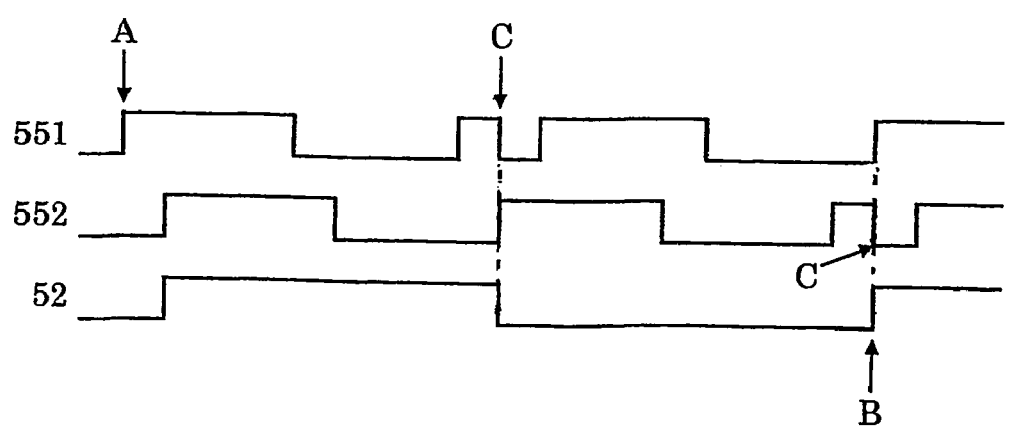
FIG. 14 schematically shows the output signals of the phase shifter section and the frequency divider shown in FIG. 9.
Figure 10:
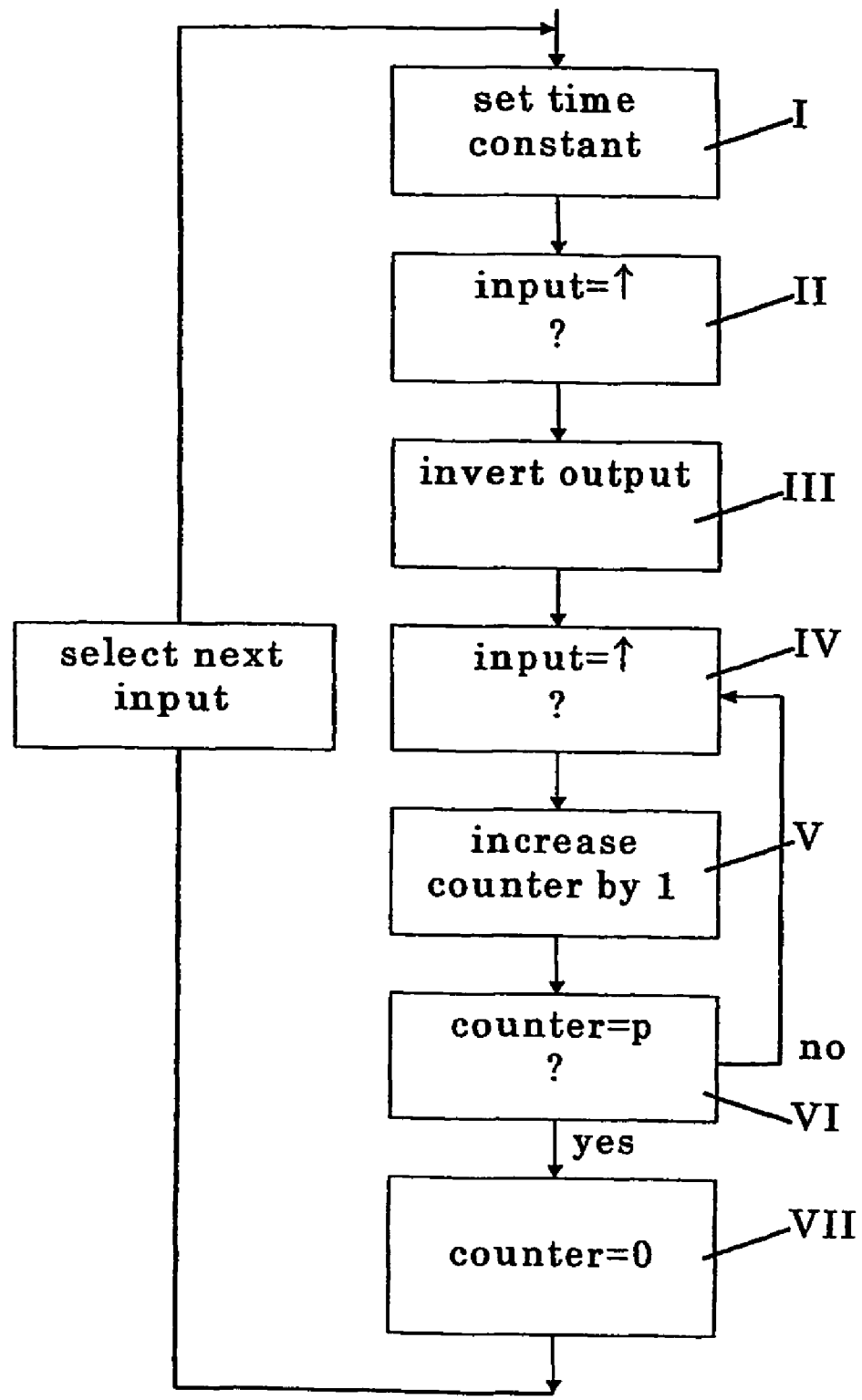
FIG. 10 shows a flow chart of a second example of a method for dividing a frequency.

In the frequency divider shown in FIG. 9, the count and select section 54 may perform an operation according to the flow-chart shown in FIG. 10. Of the shifter outputs 551–552 only one at the time is actually used as input to the count and select section 54. The development in time of the signals at the phase shifter outputs 551, 552 and the count and select output 52 is shown in FIG. 14. At the start in step I the phase shift of the signal of a selected one of the shifter outputs 561–552 is set to a phase shift phi by one of phase shift adjusters 5461,5462.

If the signal from the selected shifter input has an upward transition, as is indicated with arrow A in FIG. 14, the criterion of step II is satisfied and the output of the generator device 544 is inverted in step III by inverter section 543 from one binary state to the opposite binary state, as is indicated by arrow B in FIG. 14. As an alternative it is possible to implement the switching from one binary state to the other in the signal generator section. If the signal from the shifter output has a upward transition, i.e. the criterion of step IV is satisfied, the value of the counter 542 increases one count in step V. Thereafter, the counter is reset to zero in step VII if the criterion of step VI is satisfied, that is after P periods, in FIG. 14 P is set to one. It should be noted that the switching at P/2 counts is omitted in the method shown in FIG. 10. The switching at P/2 counts can be introduced in the divider just as in the divider of FIG. 2. Because the switching at P/2 counts is omitted, the total division ratio is doubled. Thereby, the frequency of the divider output signal is different with respect to the signal from a divider with a switching at P/2 counts, but still the frequency of the output signal is a non-integer fraction of the frequency of the input signal.

After a number of counts P, the counter is switched, after step VII, to the second shifter output 552. At the end of step VII, at the moment the count and select section 54 switches to another one of the outputs of the phase shifter section 53, a new signal has to be available. The phase shift of the second shifter output 552 is set to phi+phi$_{res}$, where phi$_{res}$ denotes the required resolution and the count and select section 54 of FIG. 9 performs the described division operation again. While the counter continues counting upward transitions of the signal presented at the second shifter output, the phase shift of the signal presented at the first shifter output 551 is adjusted to a new time phase shift phi+2*phi$_{res}$, as is indicated with arrow C in FIG. 14, and the whole process is repeated.

Figure 5:
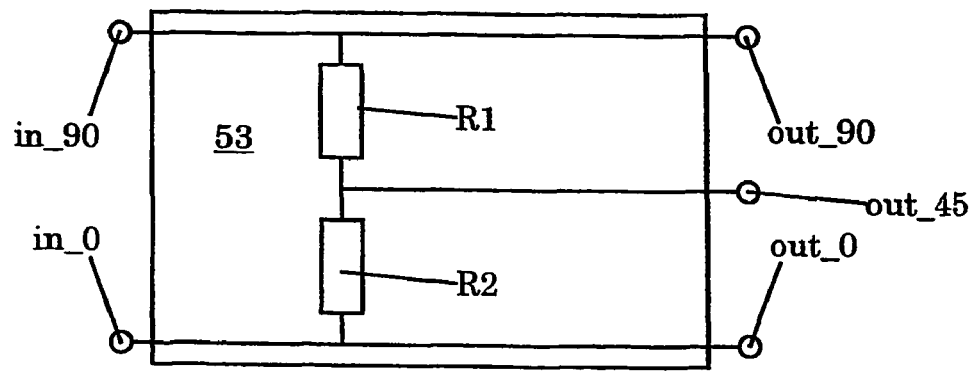
FIG. 5 shows a circuit diagram of an first example of an embodiment of a phase splitter section of a frequency divider.

In the frequency divider shown in FIG. 2 a phase splitter section as shown in FIG. 5 may be used. In FIG. 2, a first balanced input signal is applied to the phase splitter section 53 at one of the divider inputs 51a–51b and at the other input a second balanced input signal is applied to the phase splitter section 53. The second balanced signal differs in phase with respect to the first balanced input signal. In the shown example, it is assumed that the second balanced signal is 90 degrees shifted in phase with respect to the first balanced input signal. Both signals are usually already available in many types of devices, like for instance complex transceivers with image rejection.

Based on the signals at the divider inputs 51a,51b the phase splitter section 53 shown in FIG. 5 generates phase shifted output signals and transmits the phase shifted output signals via phase splitter output connections 551–558 to the count and select section 54. The phase splitter section of FIG. 5 is a phase splitter section 53 which generates a signal with a phase of 45 degrees at an output out_45. At an input in_0 an input signal is provided. The same input signal shifted 90 degrees in phase is provided at an input in_90. As explained, a +90 or −90 degrees phase shifted signal is usually available in image reject devices and other devices. The inputs in_0, in_90 are connected via resistors R1 and R2. At the node between the resistors R1, R2, the output out_45 is connected. The signal s_45 at output out_45 has a phase shifted over 45 degrees with respect to the signal at input in_0, because:

$$s\_45 = \sin(wt) + \sin(wt + 90°)$$
$$= 2\sin\left(\frac{wt - wt - 90°}{2}\right)\sin\left(\frac{wt + wt + 90°}{2}\right)$$
$$= 2\sin(45°)\sin(wt + 45°)$$
$$= \sqrt{2}\sin(wt + 45°)$$

Figure 6:
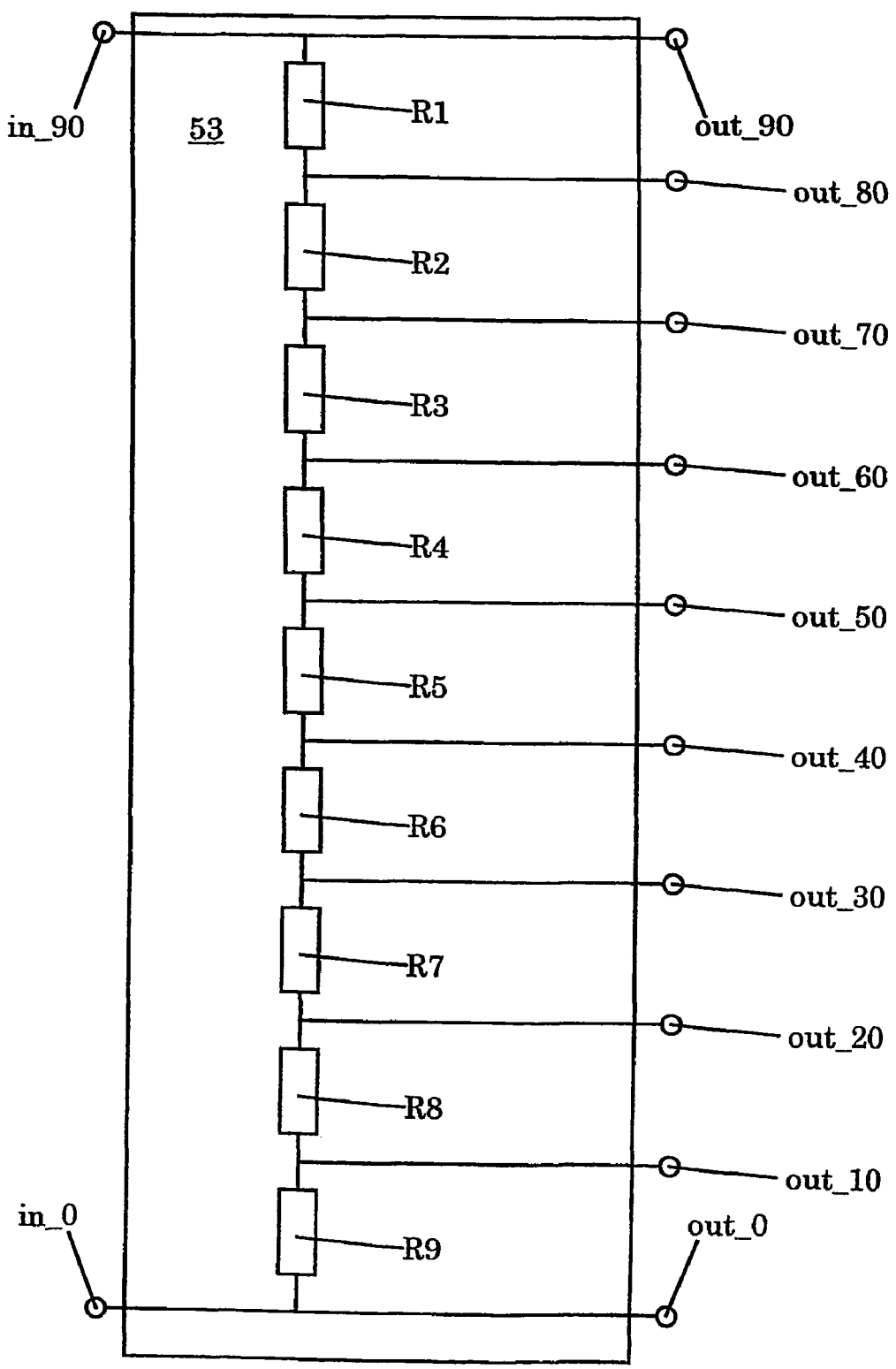
FIG. 6 shows a circuit diagram of an second example of an embodiment of a phase splitter section of a frequency divider.

The type of phase-splitter shown in FIG. 5 may be extended with more resistors and output contacts. In FIG. 6 for example, a phase splitter is shown wherein signals with a 10 degree phase resolution between 0 and 90 degrees are available at outputs out_0-out_90. The outputs out_0-out_90 are connected with resistors R1–R9. The resistance of the resistors R1 and R2 and R1–R9 resp. in FIGS. 4 and 5 may be selected such that the contribution of the two input signals is equal. For the splitter shown in FIG. 5 this criterion results in the values listed in table 2.

TABLE 2

| resistor | resistance (kOhm) |
|---|---|
| R1 | 1.5 |
| R2 | 1.17 |
| R3 | 0.99 |
| R4 | 0.90 |
| R5 | 0.874 |
| R6 | 0.90 |
| R7 | 0.99 |
| R8 | 1.17 |
| R9 | 1.5 |

Apart from purely resistive splitters as shown in FIGS. 5 and 6, capacitive splitters, inductive splitters or a combination of such splitters may be used.

Figure 8:
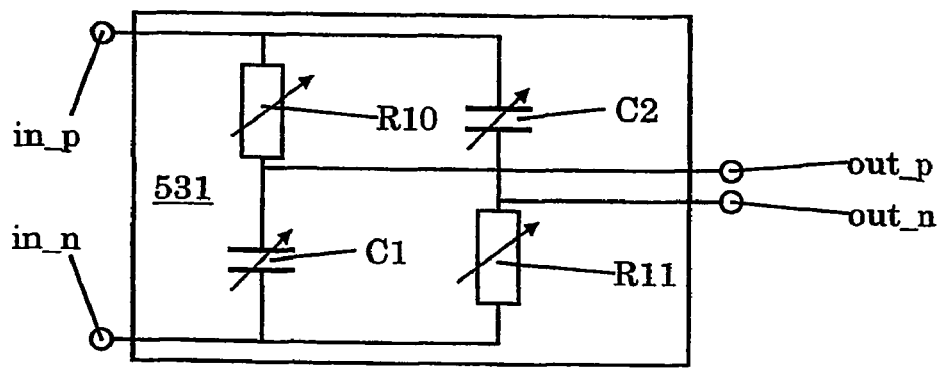
FIG. 8 shows a circuit diagram of a third example of an embodiment of a phase shifter section of a frequency divider.

In the example of an embodiment of a frequency divider as shown in FIG. 9, the phase shifter section 53 differs from the phase splitter devices shown in FIGS. 5 and 6. The phase shifter 53 of FIG. 9 includes two filter sections 531 and 532 each connected to one of the phase shifter outputs 551,552. An example of suitable filter sections 531 (or 532) is schematically shown in FIG. 8. The filter 531 in FIG. 8 is an all-pass filter section. The amplitude of the filter output signal is flat in the frequency domain. The filter section includes two balanced substantially similar filters. A first filter is formed by a resistor R10 and a capacitor C1 and a second filter is formed by resistance R11 and capacitor C2. The phase shift phi of the output signal of each of the filters with respect to the input signal depends directly on the time-constant of the filter. The time constant is equal to the product of the resistance and capacitance. The phase shift phi is substantially equal to:

phi=2 arctan(wRC), wherein w is the frequency of the signal; R is the resistance of the resistor and C is the capacitance of the capacitor. The time constant of the filter sections 531–532 is adjustable if the resistance and/or the capacity of one or more of the resistors and/or capacitors is adjustable. Thus the phase adjuster sections 5461 and 5462 set the resistances and/or capacitances in the filter section connected to the selected one of the shifter outputs 551–552 to a predetermined value to obtain the desired time constant and corresponding phase shift.

If an adjustable phase shifter section is used, the shifter section may also have only one shifter output and the phase shift of the this single output may after each repetition of the division operation be set to a new phase shift. The phase shift may also be adjusted continuously, such that an infinite frequency resolution is realised. Continuously adjustable phases may be realised by e.g. continuously adjusting the resistance in the filter sections (e.g. using Metal Oxide Semiconductor Field Effect Transistors (MOS FETs) operating in the triode region) and/or by using varactors as capacitance and/or using adjustable inductances. The shown filter is an all-pass filter, it is likewise possible to use one or more low-pass filters, one or more high-pass filters or one or more poly-phase filters or a combination thereof.

In the shown examples the phase shifter is in the proximity of the count and select section. As an alternative, the phase shifter section may be at a different physical location. In devices wherein a number of phase shifted signals is already available, the phase shifter section may logically be implemented in several sections of the entire device and thus not be physically present. For example in balanced image reject receiver front-ends, transmitters and transceivers, signals with 180 degrees and +90 and −90 degrees phase difference are already available and therefore a separate shifter section may not be necessary. Furthermore, the phase-splitter section may be implemented as a ring oscillator section. In general a ring oscillator includes a circular chain consisting of an odd number of inverters.

In the example of a divider in FIG. 2, the inputs of the phase plitter section are connected to a phase calibration section 55. The phase calibration section 55 ensures the required phase difference between the input signals of the section 53, i.e. in the example given 90 degrees. The phase calibration section 55 includes a phase detector circuit 550 which detects the phase difference of its input signals. The phase detector circuit 550 controls a phase shifter circuit 559 which shifts the phase of the signal to the required phase difference. If the phases of the respective signals are known to be sufficiently accurate, a phase calibration section may be omitted in the frequency divider.

It should be noted that in all of the above mentioned implementations it is possible to add a (relatively slowly varying) signal to the phase-shifted signals such that the output signal contains phase and/or frequency modulation. In the examples presented above, the basis used for the phase-splitter is 90 degrees. Other bases can be used as well: e.g. 0 degrees and 135 degrees can also be used.

Furthermore, the 0 and 90 degrees phase-shifter signals may be used as a radio frequency (rf) input in an image reject mixer. In such a mixer the rf input may be combined with Local Oscillator signals. The mixer may be implemented in receiver, transmitter or transciever devices. A frequency divider as described also may be used in a PLL, for example in the PLL 1 in FIG. 1 a frequency divider as shown in FIG. 2 or 9 may be used.

Furthermore, the frequency divider may be connected to other frequency dividers, such as a delta-sigma divider or a fractional divider. A fractional divider may then be provided with means to compensate for the spurious frequencies generated by the fractional divider. Also, the division ratio may be (continuously) adjusted by means of a delta-sigma modulator in order to obtain a frequency or phase modulation.

The 0 and 90 degrees phase-shifter signals may also be calibrated to minimise spurious components in the output signal of the frequency divider and/or other device connected to the frequency divider.

Figure 11:
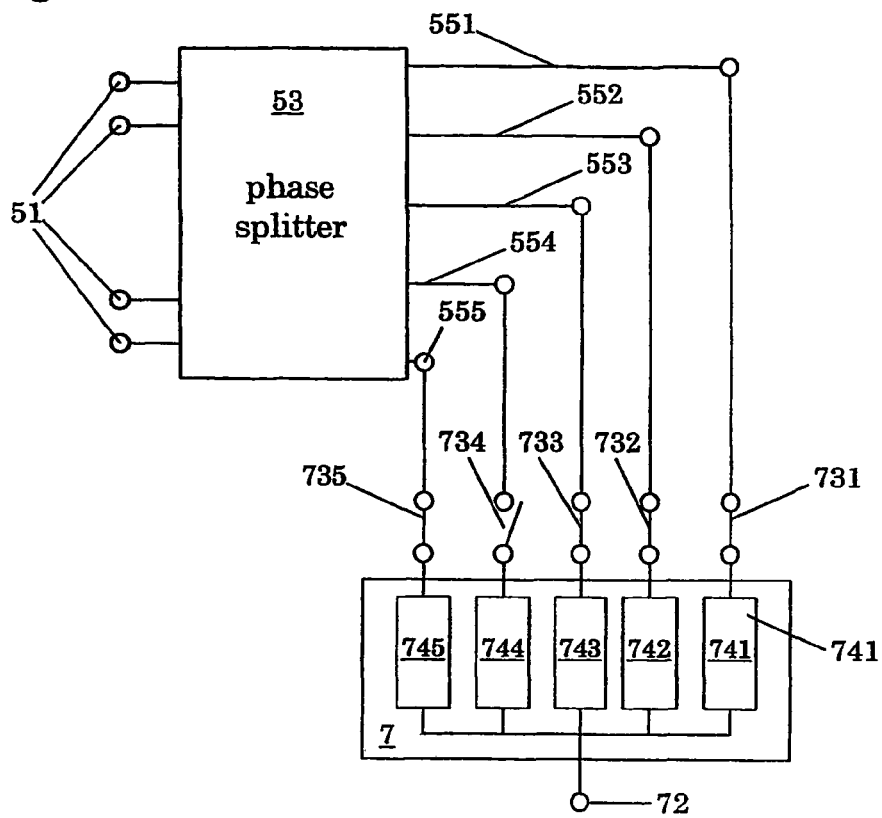
FIG. 11 shows a block diagram of an example of an embodiment of a frequency generator device.
Figure 12:
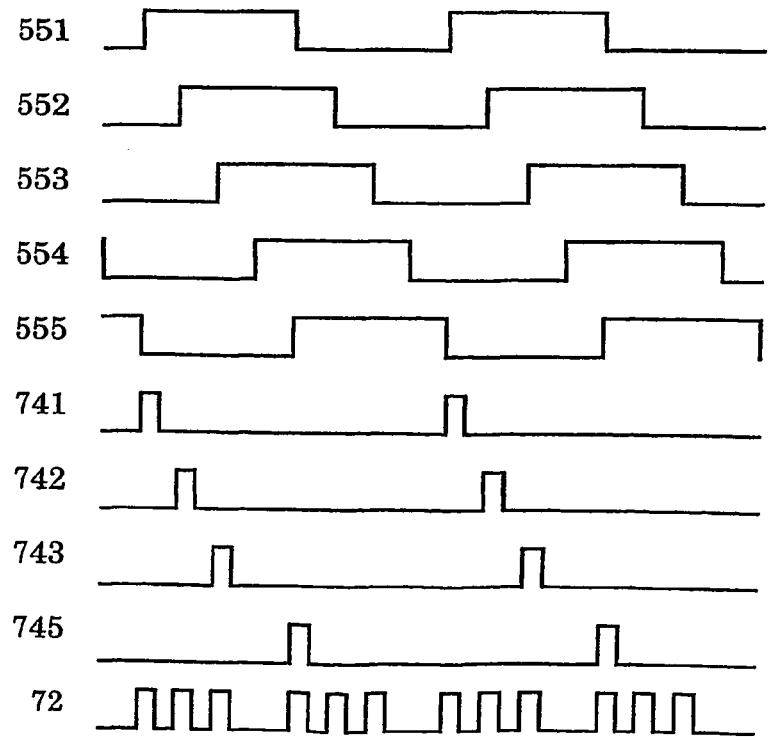
FIG. 12 shows phase splitter output signals and signals in successive steps of a frequency generation method.

A frequency divider according to the technology can also be used in a frequency generator device. An example of such a frequency generator is shown in FIG. 11. In the shown generator, the phase-splitter output signals are used for generating harmonics or other frequencies based on the input signal. FIG. 12 shows signals in successive stages of such signal generation. Each upgoing slope of one of the phase shifted signals generates a small pulse. These small pulses are combined, resulting in a generated signal at the frequency generator output 72. The frequency generation section 7 includes switch devices 741–745. Each of the switch devices 741–745 connects one of the splitter divider outputs 551–555 to a pulse generator 741–745.

Figure 13:
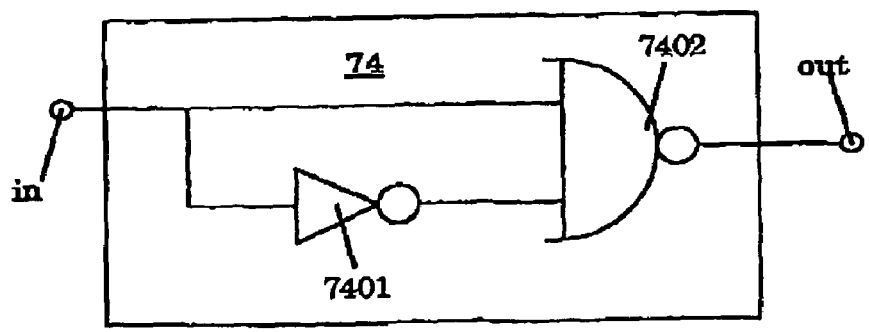
FIG. 13 shows a block diagram of an example of a pulse generator device for a frequency generator device as shown in FIG. 11.

FIG. 13 shows an embodiment of a pulse generator 74. In the device 74 shown in FIG. 13, the input signal is supplied to an NAND-circuit 7402 and to an inverter 7401. The inverter 7401 inverts and delays the input signal. The NAND-circuit output signal is then a small pulse. By optimising the delay in the inverter 741, or by using multiple inverters, the duty-cycle of the output signal can be made equal to 50%.

By combining the appropriate outputs, the required frequency will be available at the output 72 of the generator 7. In general every higher order frequency of the frequency of the input signal of the splitter may be generated. If for example all switches 731–735 are closed, the $4^{th}$ harmonic of the signal will be generated and if only switches 731,733 and 735 are closed, the second harmonic will be generated.

As for generation of a higher order frequency only the phase shifted signals and the generator section 7 are necessary, the count and select section 54 may be omitted. If the phase shifted signals are already available in the circuitry, for example in balanced image reject receivers as is described above, the phase splitter section may also be omitted.

The invention claimed is:

1. A frequency divider device comprising:
   a phase shifter section comprising:
      a first shifter input for receiving a first shifter input signal and
      a second shifter input for receiving a second shifter input signal having a phase difference with respect to said first shifter input signal;
      a plurality of shifter outputs for outputting as phase shifted signals at least two of: a first signal, a second signal, and at least one intermediate phase signal, said phase shifted signals having a phase shift with respect to each other;
      said phase shifter section being arranged to generate said intermediate phase signal by superimposing said first signal on said second signal, the first signal being based on the first shifter input signal and the second signal being based on the second shifter input signal;
   a phase count and select section comprising:
      at least two phase count and select inputs each communicatively connected to the phase shifter outputs, for receiving each at least one of said phase shifted signals;
      a signal generator section for generating an output signal;
      a switch device having at least two switch inputs each connected to at least one of said phase count and select inputs, said switch device further having at least one switch output, said switch device connecting a selected input of said switch inputs with said switch output;
      an inverter device for switching said output signal from a current state to a substantially inverse state when a selected signal from said selected input has a transition from a first state to a second state;
      a counter device for determining a number of periods of said selected signal;
      a switch actuator device for switching said switch device to another one of said switch inputs when a value of said counter device has reached a preset switching value; and
      a divider output for transmitting said output signal.

2. A frequency divider device as claimed in claim 1, wherein said phase shifter section is a phase splitter section including: a chain of splitter components, said chain having a first end connected to said first shifter input and a second end connected to said second shifter input, said chain including at least one node at which at least two splitter components are connected to each other, and wherein at least one of said shifter outputs is connected to at least one of said nodes.

3. A frequency divider device as claimed in claim 2, wherein said phase splitter section comprises a resistive splitter, a capacitive splitter, an inductive splitter, or a combination of such splitters.

4. A frequency divider device as claimed in claim 2, wherein the chain of splitter components comprises at least two resistors with a resistance selected such that a contribution of the first and second shifter input signals to the intermediate phase signal is equal.

5. A frequency divider device as claimed in claim 1, wherein said phase shifter section includes at least one filter section having an adjustable time constant and an actuator device for adjusting said adjustable time constant after a predetermined number of periods of said selected phase shifted signal.

6. A frequency divider device as claimed in claim 5, wherein said filter section includes at least a low-pass filter.

7. A frequency divider device as claimed in claim 5, wherein said filter section includes at least a high-pass filter.

8. A frequency divider device as claimed in claim 5, wherein said filter section includes at least an all-pass filter.

9. A frequency divider device as claimed in claim 5, wherein said filter section includes at least a poly-phase filter.

10. A frequency divider device as claimed in claim 5, wherein said filter section includes at least one varistor.

11. A frequency divider device as claimed in claim 5, wherein said filter section includes at least one variable capacitor.

12. A frequency divider device as claimed in claim 5, wherein said filter section includes at least one variable inductor.

13. A frequency divider device as claimed in claim 1, wherein an input frequency is a non-integer multiple of the frequency of said output signal.

14. A frequency divider device as claimed in claim 1, wherein in use the division ratio of the frequency divider device changes continuously.

15. A frequency divider device as claimed in claim 1, further including at least phase calibration section for controlling the phase of the second shifter input signal with respect to the phase of the first shifter input signal.

16. A phase locked loop circuit comprising:
a loop input;
a phase detector section for detecting a phase difference between an input signal and a reference signal, said phase detector section having a detector input connected to said loop input, a reference input and a detector output for outputting a signal related to said phase difference;
a filter section having a filter input connected to said detector output section and a filter output;
a voltage controlled oscillator having an input connected to said filter output and an oscillator output connected to a loop output; and
a frequency divider device as claimed in claim 1 having a divider input connected to said loop output and a divider output connected to said reference input.

17. An electronic device including a frequency divider device as claimed in claim 1.

18. An electronic device as claimed in claim 15, wherein said electronic device is selected from a group including a receiver device, a transmitter device, a transceiver device.

19. A method for dividing the frequency of a signal, including
a: generating at least one intermediate phase signal having a phase between a first input signal and a second input signal, the second input signal having a phase difference with respect to said first input signal, by superimposing a first signal based on said first input signal and a second signal based on said second input signal;
b: outputting at least two of said first signal, said second signal, and an intermediate phase signal as phase shifted signals, said phase shifted signals having a phase shift with respect to each other;
c: selecting a selected signal from said phase shifted signals;
d: counting a number of times said selected signal has an upward transition;
e: generating an output signal of a first binary state until first predetermined number of transitions is counted; and
when said first predetermined number of transitions is counted:
f: generating an output signal of a second binary state substantially inverse to the first binary state;
g: repeating steps c–f when a second predetermined number of transitions of said selected signal first is counted.

20. A method according to claim 19, including:
applying at a first end of a chain of splitter components said first input signal;
applying to a second end of said chain said second input signal, and
outputting at least one of said phase shifted signals at a node of said chain, at which node at least two splitter components are connected to each other.

21. A method according to claim 20, wherein said phase splitter section comprises a resistive splitter, a capacitive splitter, an inductive splitter, or a combination of such splitters.

22. A method according to claim 20, wherein the chain of splitter components comprises at least two resistors with a resistance selected such that the contribution of the first and second input signals to said at least one intermediate phase signal is equal.

23. A method as claimed in claim 19, including:
generating at least one intermediate phase signal with a first predetermined phase shift;
and after a predetermined number of periods of said selected signal:
generating at least one intermediate phase signal with a second predetermined phase shift different from said first predetermined phase shift; and
performing said switching said output signal from said first binary state to said second binary state or vice versa.

24. A method as claimed in claim 23, wherein said generating intermediate phase signal includes filtering said first and second input signals.

25. A method as claimed in claim 24, wherein said filtering includes at least low pass filtering.

26. A method as claimed in claim 24, wherein said filtering includes at least all-pass filtering.

27. A method as claimed in claim 24, wherein said filtering includes at least high pass filtering.

28. A method as claimed in claim 23, wherein said filtering includes at least poly-phase filtering.

29. A method as claimed in claim 19, wherein said generating of at least one intermediate phase signal with a second predetermined phase shift includes adjusting the resistance of an adjustable resistor.

30. A method as claimed in claim 19, wherein said generating of at least one intermediate phase signal with a second predetermined phase shift includes changing the capacitance of a varactor.

31. A method as claimed in claim 19, wherein said generating of at least one intermediate phase signal with a second predetermined phase shift includes changing the inductance of an adjustable inductance.

* * * * *